(12) United States Patent
Tsunekawa et al.

(10) Patent No.: US 7,798,062 B2
(45) Date of Patent: Sep. 21, 2010

(54) PRINTING APPARATUS AND PRINTING METHOD

(75) Inventors: Makoto Tsunekawa, Osaka (JP); Toshikazu Baba, Osaka (JP)

(73) Assignee: Nitto Denko Corporation, Osaka (JP)

(*) Notice: Subject to any disclaimer, the term of this patent is extended or adjusted under 35 U.S.C. 154(b) by 685 days.

(21) Appl. No.: 11/730,033

(22) Filed: Mar. 29, 2007

(65) Prior Publication Data

US 2007/0227372 A1 Oct. 4, 2007

(30) Foreign Application Priority Data

Mar. 31, 2006 (JP) ............... 2006-097971

(51) Int. Cl.
*B41M 1/12* (2006.01)
(52) U.S. Cl. ................... 101/129; 101/123
(58) Field of Classification Search ............... 101/116, 101/118, 123, 124, 129, 424.1
See application file for complete search history.

(56) References Cited

U.S. PATENT DOCUMENTS 5,951,779 A 9/1999 Koyanagi et al.
6,709,699 B2* 3/2004 Ema et al. .............. 427/240
2002/0179690 A1 12/2002 Kawashima et al.
2004/0121617 A1* 6/2004 Kawano et al. ......... 438/781

FOREIGN PATENT DOCUMENTS

| CN | 1204863 A | 1/1999 |
|---|---|---|
| JP | 7-20472 | 1/1995 |
| JP | 2000-150565 | 5/2000 |
| JP | 2001-077157 | 3/2001 |
| JP | 2002-100857 | 4/2002 |
| JP | 2004-103712 | 4/2004 |
| JP | 2004-356268 | 12/2004 |

OTHER PUBLICATIONS

Kenji Numakura, "Introductory High Density Flexible Board," Fig. 5.30, Nikkan Kogyo Shinbun Co., Ltd.

* cited by examiner

*Primary Examiner*—Ren Yan
(74) *Attorney, Agent, or Firm*—Jean C. Edwards, Esq.; Akerman Senterfitt

(57) ABSTRACT

A printing apparatus includes a feed-out unit for feeding out an elongated base material which is wound up in a roll, a printing unit for printing a liquid resist onto the elongated base material that is fed out of the feed-out unit, a wind-up unit for winding up the elongated base material on which the liquid resist is printed by the printing unit into a roll, and a suction unit positioned between the printing unit and the wind-up unit in a transport direction of the elongated base material for sucking up a solvent in the liquid resist.

7 Claims, 3 Drawing Sheets

(a)

(b)

(c)

PRINTING APPARATUS AND PRINTING METHOD

CROSS-REFERENCE TO RELATED APPLICATION

The present application claims priority from Japanese Patent Application No. 2006-97971 filed on Mar. 31, 2006, the content of which is hereby incorporated by reference into this application.

BACKGROUND OF THE INVENTION

1. Field of the Invention

The present invention relates to a printing apparatus and to a printing method and, more particularly, to a printing apparatus for continuously printing a liquid resist onto an elongated base material and to a printing method using the printing apparatus.

2. Description of the Related Art

It has been known to continuously print conductive patterns onto a belt-like elongated film by a TAB (Tape Automated Bonding) method.

To form a solder resist covering the conductive patterns, the method includes forming the conductor patterns, continuously screen-printing a liquid resist, and then drying the printed liquid resist. In consideration of a filling property of the liquid resist into the gaps between the conductive patterns, ensuring a film thickness, and a mold release property from a screen printing plate, the liquid resist contains an appropriate amount of solvent relative to a resin for forming the resist.

As an example of such an apparatus for continuously printing a solder resist, a continuous printing apparatus has been proposed comprising a film supply unit for supplying a belt-like film by unreeling the film out of a film supply reel, a printing processing unit for printing a coating on the supplied film, a preparatory drying means for preparatorily drying the coating printed on the film, and a film collection unit for collecting the film having the preparatorily dried coating by winding up around a film collection reel (see, e.g., Japanese Unexamined Patent Publication No. 2004-356268).

SUMMARY OF THE INVENTION

However, there is a case where the liquid resist printed by screen printing flows between the conductive patterns to undesirably cover a portion which intrinsically need not be covered. In such a case, the solder resist formed on the portion which need not be covered inhibits mounting of electronic components or at least degrades connection reliability, even though the mounting is not inhibited thereby.

The flowing of the liquid resist mentioned above is more likely to occur as the spacings between the conductive patterns are smaller. With the recent miniaturization of the conductive patterns, it has been a significant challenge to prevent such flowing of the liquid resist.

It is also disclosed in Japanese Unexamined Patent Publication No. 2004-356268 that, by disposing a preparatory drying means such as a blower between a printing processing unit and a film collection unit, a drying air flow is applied to a film after a print-coating process.

By thus applying the drying air flow to the film after the print-coating process before the film is collected, the liquid resist can be dried immediately after printing.

However, when the drying air flow is applied using the blower, the liquid resist is undesirably spread and may occasionally cover the portion which need not be covered.

It is therefore an object of the present invention to provide a printing apparatus which can prevent a liquid resist from flowing to a portion where the formation of the resist is intrinsically unnecessary and can print a liquid resist with high precision and to a printing method using the printing apparatus.

A printing apparatus according to the present invention comprises a feed-out unit for feeding out an elongated base material which is wound up in a roll, a printing unit for printing a liquid resist onto the elongated base material that is fed out of the feed-out unit, a wind-up unit for winding up the elongated base material on which the liquid resist is printed by the printing unit into a roll, and a suction unit positioned between the printing unit and the wind-up unit in a transport direction of the elongated base material for sucking up a solvent in the liquid resist.

In the printing apparatus, before the elongated base material on which the liquid resist is printed by the printing unit is wound up by the wind-up unit, the solvent in the liquid resist is sucked up by the suction unit. Since the solvent is thus sucked up from the printed liquid resist immediately after printing, the flowing thereof is immediately suppressed thereafter. In addition, because the solvent in the liquid resist is sucked up by the suction unit, the ambient atmosphere of the liquid resist is under a negative pressure and the spread of the liquid resist can be prevented more reliably. As a result, it is possible to prevent the liquid resist from flowing to a portion where the formation of the liquid resist is intrinsically unnecessary and to print the liquid resist with high precision.

In the printing apparatus according to the present invention, it is preferable that the suction unit is positioned within a range of 1000 mm downstream of a placement portion for the elongated base material in the printing unit in the transport direction of the elongated base material.

When the suction unit is positioned within the range of 1000 mm downstream of the placement portion for the elongated base material in the printing unit in the transport direction of the elongated base material, the flowing of the liquid resist can be prevented more reliably.

In the printing apparatus according to the present invention, it is preferable that the suction unit is positioned to overlap the elongated base material in a direction of projection of a surface of the elongated base material on which the liquid resist is printed.

When the suction unit is positioned to overlap the elongated base material in the direction of projection of the surface on which the liquid resist is printed, the liquid resist can be sucked in the direction of projection and more prompt suction can be achieved.

In the printing apparatus according to the present invention, it is preferable that the suction unit is provided in a direction intersecting the transport direction of the elongated base material.

When the suction unit is provided in the direction intersecting the transport direction of the elongated base material, suction can be performed in a direction orthogonal to the transport direction of the elongated base material, i.e., in a widthwise direction. As a result, it is possible to uniformly prevent the flowing of the liquid resist in the widthwise direction.

In the printing apparatus according to the present invention, it is preferable that the suction unit comprises a portion exposed from the elongated base material in a direction orthogonal to the transport direction of the elongated base material when the suction unit is projected in the direction of projection.

In the case where the suction unit comprises the portion exposed from the elongated base material in the direction orthogonal to the transport direction of the elongated base material, when the suction unit is projected in the direction of projection, reliable suction can be performed with respect to the elongated base material along the entire width thereof. As a result, the flowing of the liquid resist can be prevented more reliably.

A printing method according to the present invention comprises the steps of feeding out an elongated base material which is wound up in a roll, printing a liquid resist onto the elongated base material that is fed out in the feed-out step; sucking up a solvent in the printed liquid resist; and a winding up the elongated base material into a roll on which the printed liquid resist sucked up in the suction step is printed.

In the printing method, before the elongated base material on which the liquid resist is printed in the printing step is wound up in the wind-up step, the solvent in the liquid resist is sucked up in the suction step. Since the solvent is thus sucked up from the printed liquid resist immediately after printing, the flowing thereof is immediately suppressed thereafter. In addition, because the solvent in the liquid resist is sucked up in the suction step, the ambient atmosphere of the liquid resist is under a negative pressure and the spread of the liquid resist can be prevented more reliably. As a result, it is possible to prevent the liquid resist from flowing to a portion where the formation of the liquid resist is intrinsically unnecessary and to print the liquid resist with high precision.

DETAILED DESCRIPTION OF THE INVENTION

Figure 1:
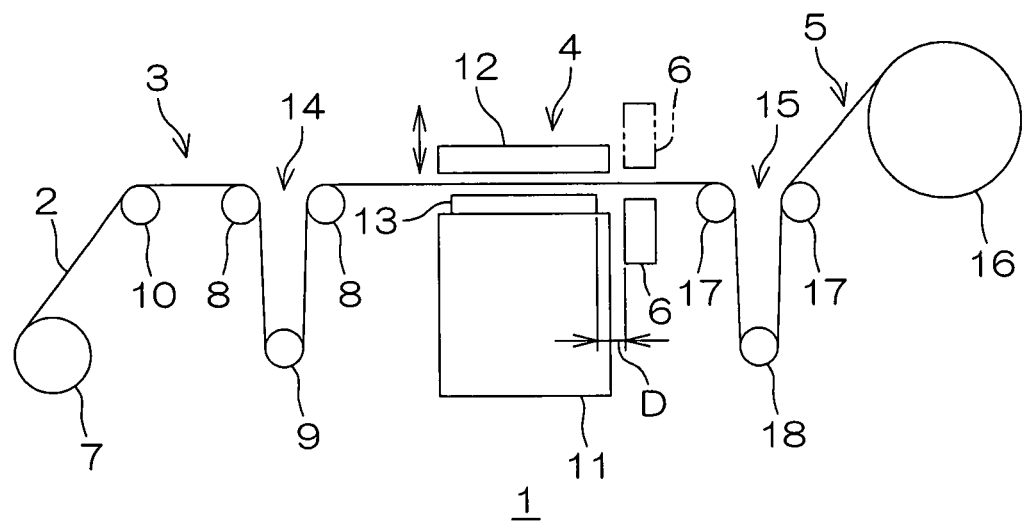
FIG. 1 showing a schematic structural view of an embodiment of a printing apparatus according to the present invention.

FIG. 1 is a schematic structural view of an embodiment of a printing apparatus according to the present invention. Referring to FIG. 1, an embodiment of a printing method according to the present invention is described in conjunction with the printing apparatus.

In FIG. 1, the printing apparatus 1 is a screen printing apparatus capable of continuous printing in accordance with a roll-to-roll method. The printing apparatus 1 comprises a feed-out unit 3 for feeding out an elongated base material 2 which is wound up in a roll, a printing unit 4 for printing a liquid resist onto the elongated base material 2 that is fed out of the feed-out unit 3; a wind-up unit 5 for winding up the elongated base material printed by the printing unit 4 into a roll; and a suction unit 6 positioned between the printing unit 4 and the wind-up unit 5 for sucking up a solvent in the liquid resist.

The feeding-out unit 3 is positioned upstream of the printing unit 4 in the direction of transport of the elongated base material 2 (hereinafter referred to as the transport direction) and comprises a feed-out roll 7 and an upstream accumulator (upstream air dancer) 14.

Around the feed-out roll 7, the elongated base material 2 before printing is wound. The elongated base material 2 is, e.g., a base material film for a wired circuit board manufactured by an RTR method or a TAB method. It may be supported on a metal supporting board such as a stainless steel foil as necessary. Examples of the elongated base material 2 include an elongated base material in which conductive patterns are printed on a resin film, such as a polyimide film for forming an insulating base film.

The upstream accumulator 14 is positioned downstream of the feed-out roll 7 in the transport direction to respond to a variation in the amount of transport of the elongated base material 2 transported to the printing unit 4. The upstream accumulator 14 comprises upper rolls 8 which are arranged in mutually spaced apart relation in the transport direction, and a lower roll 9 positioned below and between the upper rolls 8.

In addition, the feed-out unit 3 has a tension roll 10 provided between the feed-out roll 7 and the upstream accumulator 14.

In the feed-out unit 3, the elongated base material 2 is intermittently fed out for each of print areas provided thereon to be printed by the upward and downward movement of a printing processor 12 in the printing unit 4, which is described next. The elongated base material 2 that is fed out moves successively past the tension roll 10 and the upstream upper roll 8 of the upstream accumulator 14. The elongated base material 2 is then temporarily pulled down by the lower roll 9 and stretched so that the slack thereof is removed. Thereafter, the elongated base material 2 moves past the downstream upper roll 8 to be intermittently transported to the printing unit 4 on a per print-area basis (feed-out step).

The printing unit 4 comprises a platform 11 and the printing processor 12 positioned above the platform 11.

The platform 11 has an upper surface thereof provided with a stage 13 as a placement portion in the shape of a flat plate on which the print areas of the elongated base material 2 to be continuously printed are placed in succession.

The printing processor 12 comprises a known structure for screen printing, i.e., a screen frame, a screen supported on the screen frame, a squeegee for printing (coating) a liquid resist onto the elongated base material 2 via the screen, and the like, though the detailed depiction thereof is omitted.

On the screen, the liquid resist is placed. The liquid resist contains a resin component made of a photosensitive resin for forming a resist and a solvent in which the resin component is dissolved or dispersed. The solid content of the liquid resist (i.e., the concentration of the resin component) is in the range of, e.g., 20 to 80 wt %, or preferably 40 to 70 wt %.

As indicated by the arrow, the printing processor 12 is moved upward and downward relative to the stage 13. More specifically, when the unprinted area of the elongated base material 2 to be printed is placed on the stage 13, the printing processor 12 moves downward so that the squeegee prints the liquid resist onto the unprinted area via the screen. When the printing ends, the printing processor 12 is moved upward. At this time, the printed area of the elongated base material 2 is transported out of the stage 13, while the unprinted area thereof to be printed next is transported in and placed on the stage 13. Then, the unprinted area is placed on the stage 13, the printing processor 12 moves downward again, prints the liquid resist onto the unprinted area, and is moved upward again. The printed area of the elongated base material 2 is transported out of the stage 13, while the unprinted area thereof to be printed next is placed on the stage 13.

In the printing unit 4, the upward and downward movement of the printing processor 12 described above and the intermittent transportation of the elongated base material 2 described above are repeated, whereby the continuous printing of the liquid resist onto the individual print areas of the elongated base material 2 is performed (printing step).

The wind-up unit 5 is positioned downstream in the transport direction of the elongated base material 2 and comprises a downstream accumulator (downstream air dancer) 15, and a wound-up roll 16.

The downstream accumulator 15 is provided to respond to a variation in the amount of transport of the elongated base material 2 transported from the printing unit 4, and comprises upper rolls 17 which are arranged in mutually spaced apart relation in the transport direction, and a lower roll 18 positioned below and between the upper rolls 17.

The wind-up roll 16 is positioned downstream of the downstream accumulator 15 in the transport direction to wind up the elongated base material 2 after printing.

In the wind-up unit 5, the elongated base material 2 after printing that is transported from the printing unit 4 moves past the upstream upper roll 17 of the downstream accumulator 15 and is then temporarily pulled down by the lower roll 18 and stretched so that the slack thereof is removed. Thereafter, the elongated base material 2 moves past the downstream upper roll 17 to be wound up by the wind-up roll 16 (wind-up step).

In the printing apparatus 1, the suction unit 6 is provided between the printing unit 4 and the wind-up unit 5 in the transport direction.

Figure 2:
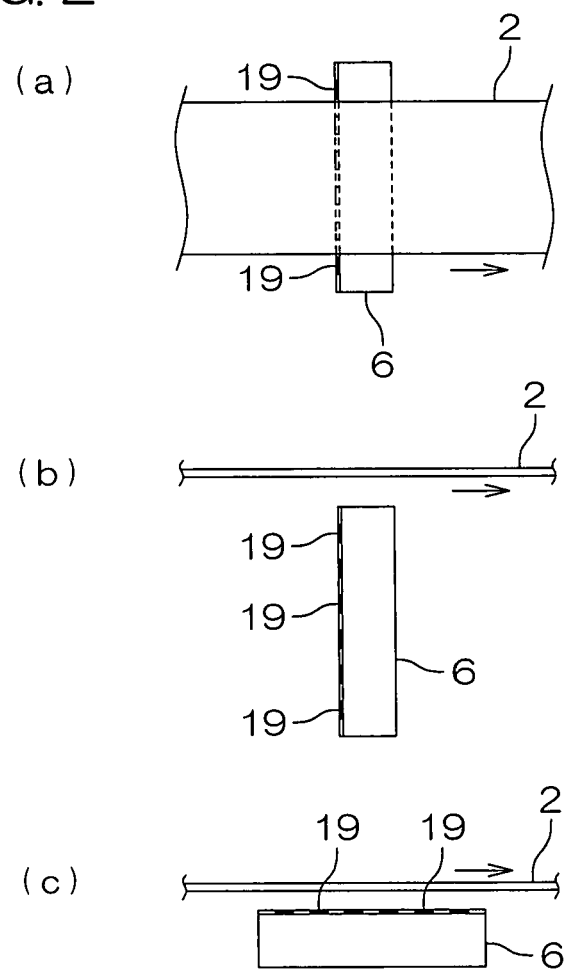
FIG. 2 showing an enlarged view of a principal portion of the periphery of a suction unit (arranged below) in the printing apparatus shown in FIG. 1:
(a) showing a plan view thereof;
(b) showing a side view thereof; and
(c) showing a side view of another embodiment thereof (an aspect in which suction holes face a back surface of an elongated base material)

As shown in FIGS. 2(*a*) and 2(*b*), the suction unit 6 is a suction duct formed in the shape of a flat hollow box which is horizontally longer than the full width of the elongated base material 2. The suction unit 6 has one side surface formed with a large number of suction holes 19 which are aligned in both vertical and horizontal directions.

When each of the suction holes 19 is circular, it has a diameter in the range of, e.g., 5 to 20 mmϕ, or preferably 5 to 10 mmϕ. When each of the suction holes 19 is quadrilateral, it has a side of a length in the range of, e.g., 5 to 20 mmϕ, or preferably 5 to 10 mmϕ. In either case, the suction holes 19 are formed such that the vertical and horizontal spacings between the adjacent ones are in the range of, e.g., 3 to 20 mm, or preferably 5 to 10 mm. In a duct provided for odor prevention or the like, suction holes having sizes larger than the range shown above are normally formed to suck odor. However, when the hole sizes are larger than the range shown above, the suction of the liquid resist immediately after printing may be insufficient.

More specifically, the suction unit 6 is positioned such that the distance D from the downstream end portion of the stage 13 of the printing unit 4 to the side surface of the suction unit 6 in which the suction holes 19 are opened is not more than 1000 mm, preferably not more than 800 mm, more preferably not more than 500 mm, or still more preferably not more than 300 mm.

The suction unit 6 is also positioned below the elongated base material 2 to be transported (that is, in the direction of projection of the print area (print surface) of the elongated base material 2, i.e., in such a manner as to overlap the elongated base material 2 when viewed in plan view) along the widthwise direction of the elongated base material 2 such that the side surface thereof in which the suction holes 19 are opened faces the stage 13.

At the position, the suction unit 6 has the widthwise both ends thereof exposed from the widthwise both ends of the elongated base material 2 when viewed in plan view, and the exposed portions are also opened with the suction holes 19, as shown in FIG. 2(*a*). In this case, the suction holes 19 are not necessarily formed between the exposed portions at the widthwise both ends (middle of the widthwise direction) so long as they are formed in each of the exposed portions.

The suction unit 6 is connected to a vacuum line which is not shown. The vacuum line is adapted to suck at an amount of suction (an amount of exhaust) of, e.g., 12 to 18 m/minute while printing so that the solvent in the liquid resist immediately after printing is sucked from the printed area of the elongated base material 2 into the large number of suction holes 19 of the suction unit 6 (suction step).

The suction unit 6 sucks such that the ambient concentration of the solvent at the surface of the printed area of the elongated base material 2 immediately after printing is, e.g., not more than 3 ng/cm$^3$, preferably 2 ng/cm$^3$, or more preferably 1 ng/cm$^3$, and that the ratio of the solid content of the liquid resist after suction to that of the liquid resist before suction (before printing) is, e.g., not more than 60 wt %, or preferably not more than 30 wt %.

The ambient concentration of the solvent can be measured by collecting ambient atmosphere into an aspiration tube at 50 ml/minute for five minutes, and then quantitatively analyzing the collected ambient atmosphere using a gas chromatograph/mass spectrometer (GC/MS). When the ambient concentration of the solvent exceeds 3 ng/cm$^3$, there is a case where the liquid resist flows over a distance of, e.g., 120 μm and the flowing thereof cannot be suppressed.

The ratio (residual solvent ratio) of the solid content of the liquid resist after suction to that of the liquid resist before suction can be measured by cutting out the elongated base material 2, sealing the cut piece in an air-tight container, heating at 150° C. for 30 minutes, and quantitatively analyzing generated gas. When the ratio exceeds 60 wt %, there is a case where the liquid resist flows over a distance of, e.g., 150 μm and the flowing thereof cannot be suppressed.

In the printing apparatus 1, the suction unit 6 is positioned between the printing unit 4 and the wind-up unit 5 as described above, more specifically, is positioned such that the distance D from the downstream end portion of the stage 13 to the side surface of the suction unit 6 in which the suction holes 19 are opened is set to not more than 1000 mm. Consequently, from the printed area of the elongated base material 2 that is printed with the liquid resist in the printing unit 4, the solvent in the liquid resist is sucked up as described above in the suction unit 6 before the printed area is transported to the downstream accumulator 15. Since the solvent is thus sucked out of the printed liquid resist immediately after printing, the flowing thereof is suppressed immediately thereafter. In addition, because the suction unit 6 sucks up the solvent in the liquid resist, the ambient atmosphere around the liquid resist is under a negative pressure and the spread of the liquid resist can be prevented more reliably.

As a result, when the elongated base material 2 is a base material film for a wired circuit board made of a insulating base layer having conductive patterns printed thereon, it is possible to effectively prevent the liquid resist that is filled in the gaps between the conductive patterns by printing in the printing unit 4 from flowing (in terms of figures specifically, flowing over a distance of, e.g., 100 μm or more) to a portion where the formation of the liquid resist is intrinsically unnecessary, such as, e.g., a portion on which electronic components are mounted. This allows high-precision printing of the liquid resist, ensures reliable mounting of electronic components and the like, and allows an improvement in connection reliability.

In the printing apparatus 1, the suction unit 6 is positioned below the elongated base material 2 to be transported along the widthwise direction of the elongated base material 2 such that the side surface thereof in which the suction holes 19 are opened faces the stage 13. This allows the liquid resist on the printed area to be sucked from below, and thereby achieving more prompt suction. It is also possible to suck the printed area of the elongated base material 2 from both sides in the widthwise direction. As a result, the flowing of the liquid resist can be prevented uniformly in the widthwise direction.

As described above, the suction unit 6 has the widthwise both ends thereof exposed from the widthwise both ends of the elongated base material 2 when viewed in plan view, and the suction holes 19 are also opened in the exposed portions. This allows reliable suction of the liquid resist from the printed area of the elongated base material 2 along the entire width thereof. As a result, it is possible to more reliably prevent the flowing of the liquid resist.

Although the suction unit 6 has been positioned such that the side surface thereof in which the suction holes 19 are opened faces the stage 13 in the description given above as shown in FIG. 2(*b*), the positioning thereof is not particularly limited. For example, it is also possible to position the suction unit 6 such that the side surface thereof in which the suction holes 19 are opened faces the back surface of the elongated base material 2, as shown in FIG. 2(*c*).

Figure 3:
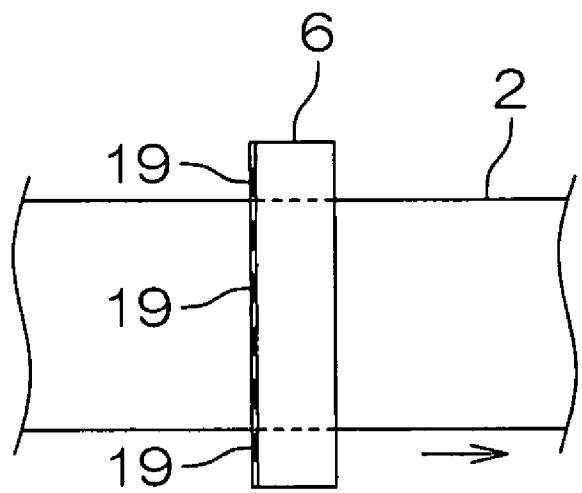
FIG. 3 showing an enlarged view of a principal portion of another embodiment of the periphery of the suction unit (arranged above) in the printing apparatus shown in FIG. 1:
(a) showing a plan view thereof;
(b) showing a side view thereof; and
(c) showing a side view of another embodiment thereof (an aspect in which suction holes face the back surface of the elongated base material)
Figure 3:
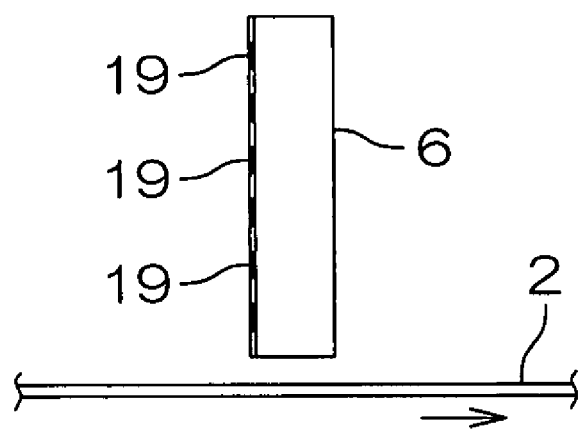
Figure 3:
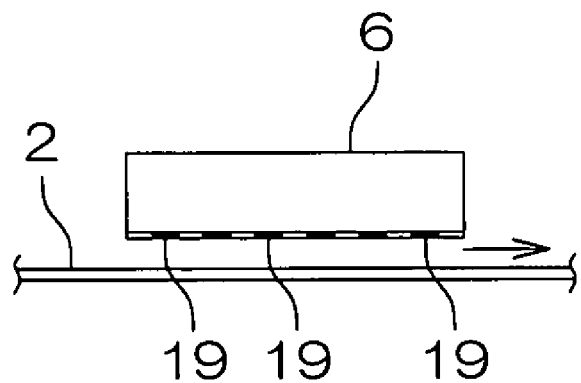

Although the suction unit 6 has been positioned below the elongated base material 2 to be transported in the description given above as shown in FIGS. 2(*a*) and 2(*b*), the suction unit 6 can also be positioned above the elongated base material 2 to be transported along the widthwise direction of the elongated base material 2 such that the side surface thereof in which the suction holes 19 are opened faces the printing processor 12, as shown in FIGS. 3(*a*) and 3(*b*).

Such positioning allows the liquid resist on the printed area of the elongated base material 2 to be sucked directly from above without being inhibited by the elongated base material 2, and thereby achieving more prompt suction. This also allows uniform suction to the printed area of the elongated base material 2 in the widthwise direction. As a result, it is possible to uniformly prevent the flowing of the liquid resist in the widthwise direction.

It is also possible to position the suction unit 6 such that the side surface thereof in the suction holes 19 are opened faces the upper surface of the elongated base material 2, as shown in FIG. 3(*c*). At such a position, the suction holes 19 directly oppose the printed area of the elongated base material 2 and therefore more efficient suction can be ensured reliably.

EXAMPLES

The present invention is described more specifically by showing the example and the comparative example thereof herein below. However, the present invention is by no means limited to the example and the comparative example.

Example 1

An elongated base material 2 (a width of 300 mm) in which a insulating base layer made of a polyimide resin having a thickness of 25 μm was laminated on a metal supporting board made of a stainless steel foil having a thickness of 25 μm, and conductive patterns having a wire width of 12 μm, a wire-to-wire spacing of 13 μm, and a thickness of 10 μm were printed on the insulating base layer was prepared and wound around a feed-out roll 7.

The feed-out roll 7 having the elongated base material 2 wound therearound is set in the printing apparatus 1 shown in FIG. 1 and a liquid resist (SN-9000 (solid content of 40 wt %) commercially available from Hitachi Chemical Co., Ltd.) was printed on the print area of the elongated base material 2 to have a thickness of 36 μm using the printing apparatus 1 shown in FIG. 1, thereby forming a solder resist covering the conductive patterns on the insulating base layer.

Figure 4:
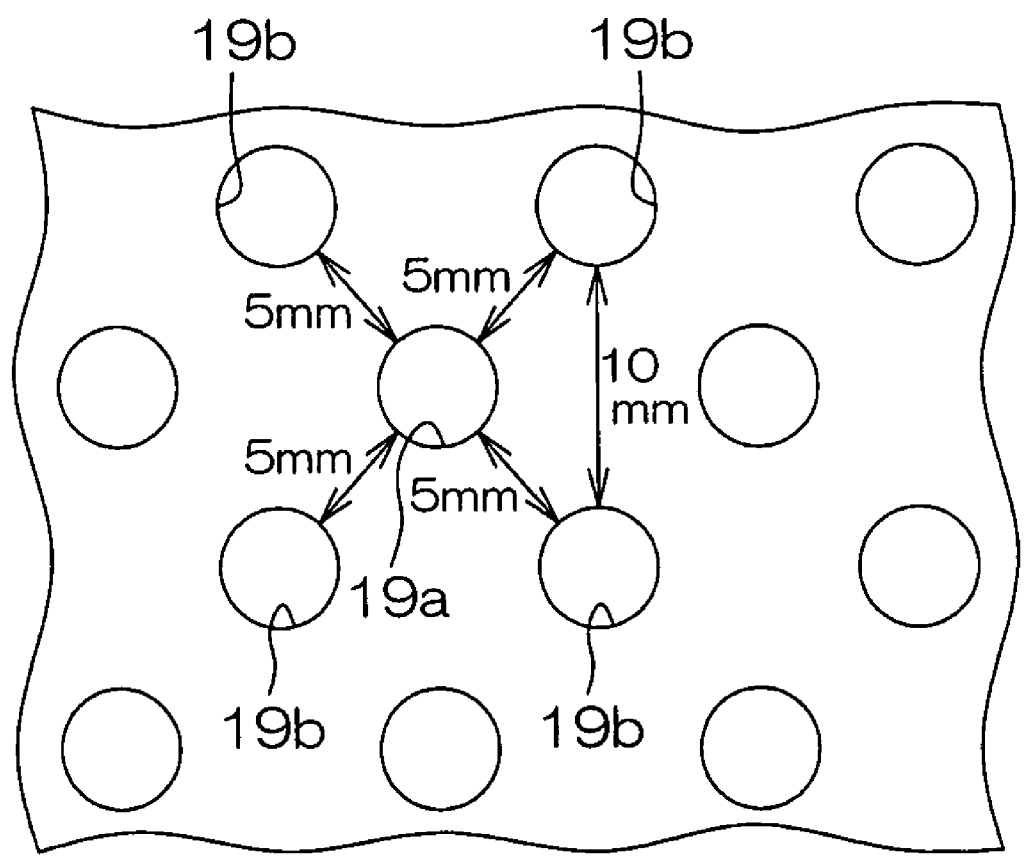
FIG. 4 showing a view illustrating the arrangement of suction holes in the suction unit of a printing apparatus according to Example 1 of the present invention.

In the printing apparatus 1, the suction unit 6 was formed in the shape of a flat, horizontally elongated hollow box having a vertical length of 140 mm and a horizontal length of 600 mm. In one side surface of the suction unit 6, the suction holes 19 each having a diameter of 10 mmφ were bored to be arranged in the area at 150 mm from the widthwise both ends in aligned relation in both vertical and horizontal directions (more specifically, the suction holes 19 were arranged in a staggered pattern as shown in FIG. 4 such that, when a suction hole 19*a* is arbitrarily taken as a reference, the distance from the reference suction hole 19*a* to each of four suction holes 19*b* arranged diagonally around the centered reference suction hole 19*a* was 5 mm, and the distance between two of the suction holes 19*b* vertically opposing was 10 mm).

Then, the suction unit 6 was positioned 20 mm below the elongated base material 2 to be transported along the widthwise direction thereof such that the distance D from the downstream end portion of the stage 13 of the printing unit 4 to the side surface of the suction unit 6 in which the suction holes 19 were opened was 800 mm, and the side surface formed with the suction holes 19 faced the stage 13. At such a position, the widthwise both ends of the suction unit 6 were exposed from the widthwise both ends of the elongated base material 2 such that each of the exposed portions was 150 mm wide and the suction holes 19 were arranged in the exposed portions. The suction unit 6 sucked at an amount of suction of 4.5 m/minute.

As a result of such suction, the ambient concentration of the solvent at the surface of the printed area of the elongated base material 2 immediately after printing was 1 ng/cm$^3$, and the residual solvent ratio was 60 wt %. The flow of the liquid resist was 50 μm, and it was recognized that the liquid resist did not flow to a portion on which electronic components will be mounted.

Comparative Example 1

The liquid resist (SN-9000 (solid content of 40 wt %) commercially available from Hitachi Chemical Co., Ltd.) was printed on the print area of the elongated base material 2 to have a thickness of 36 μm using the printing apparatus 1 shown in FIG. 1, except for the positioning of the suction unit 6 such that the distance D from the downstream end portion of the stage 13 of the printing unit 4 to the side surface of the suction unit 6 in which the suction holes 19 were opened was 1500 mm.

As a result, the ambient concentration of the solvent at the surface of the printed area of the elongated base material 2 immediately after printing was 4 ng/cm$^3$, and the residual solvent ratio was 75 wt %. The flow of the liquid resist was 100 μm, and it was recognized that the liquid resist flowed to the portion on which the electronic components will be mounted.

While the illustrative embodiments of the present invention are provided in the above description, such is for illustrative purpose only and it is not to be construed limitative.

Modification and variation of the present invention that will be obvious to those skilled in the art is to be covered by the following claims.

What is claimed is:

1. A printing apparatus comprising:
   a feed-out unit for feeding out an elongated base material which is wound up in a roll;
   a printing unit for printing a liquid resist onto the elongated base material that is fed out of the feed-out unit, the printing unit being operative to print the liquid resist onto an individual print area of the elongated base material while the elongated base material is positioned at a placement portion of the printing unit;
   a wind-up unit for winding up the elongated base material on which the liquid resist is printed by the printing unit into a roll; and
   a suction unit positioned at a fixed location between the printing unit and the wind-up unit in a transport direction of the elongated base material for sucking up a solvent in the liquid resist while the elongated base material is positioned at the placement portion of the printing unit, such that the solvent is sucked out of the liquid resist immediately after printing thereby to immediately suppress any flowing of the liquid resist,
   wherein the suction unit comprises a suction duct with a plurality of suction holes which are aligned in both a vertical direction and a horizontal direction.

2. A printing apparatus according to claim 1, wherein the suction unit is positioned within a range of 1000 mm downstream of the placement portion for the elongated base material in the printing unit in the transport direction of the elongated base material.

3. A printing apparatus according to claim 1, wherein the suction unit is positioned to overlap the elongated base material in a direction of projection of a surface of the elongated base material on which the liquid resist is printed.

4. A printing apparatus according to claim 3, wherein the suction unit is provided in a direction intersecting the transport direction of the elongated base material.

5. A printing apparatus according to claim 4, wherein the suction unit comprises a portion exposed from the elongated base material in a direction orthogonal to the transport direction of the elongated base material when the suction unit is projected in the direction of projection.

6. A printing method comprising the steps of:
   feeding out an elongated base material which is wound up in a roll;
   printing a liquid resist onto the elongated base material that is fed out in the feed-out step, the printing step being carried out while the elongated base material is temporarily stopped at a placement portion of a printing unit;
   sucking up a solvent in the printed liquid resist while the elongated base material is positioned at the placement portion of the printing unit, such that the solvent is sucked out of the liquid resist immediately after printing thereby to immediately suppress any flowing of the liquid resist, wherein the sucking step is carried out by a suction unit positioned at a fixed location downstream of the printing unit, and said suction unit comprises a suction duct with a plurality of suction holes which are aligned in both a vertical direction and a horizontal direction; and
   winding up the elongated base material into a roll on which the printed liquid resist sucked up in the suction step is printed.

7. A printing method according to claim 6, wherein the sucking step is carried out by the suction unit positioned within a range of 1000 mm downstream of the placement portion for the elongated base material in the printing unit in a transport direction of the elongated base material.

* * * * *